(12) United States Patent
Nakamori et al.

(10) Patent No.: US 7,693,597 B2
(45) Date of Patent: Apr. 6, 2010

(54) COMPUTER READABLE STORAGE MEDIUM FOR CONTROLLING SUBSTRATE PROCESSING APPARATUS

(75) Inventors: Mitsunori Nakamori, Nirasaki (JP); Tadashi Iino, Nirasaki (JP); Noritaka Uchida, Tosu (JP); Takehiko Orii, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1150 days.

(21) Appl. No.: 11/244,684

(22) Filed: Oct. 5, 2005

(65) Prior Publication Data
US 2006/0079096 A1   Apr. 13, 2006

(30) Foreign Application Priority Data
Oct. 12, 2004   (JP) ............................. 2004-297365

(51) Int. Cl.
G06F 19/00   (2006.01)
C25F 1/00   (2006.01)
C25F 3/30   (2006.01)
C25F 5/00   (2006.01)
C23F 1/00   (2006.01)
H01L 21/306   (2006.01)
H01L 21/44   (2006.01)

(52) U.S. Cl. .................. 700/123; 700/117; 700/119; 700/121; 427/96.8; 427/97.1; 427/248.1; 438/676; 438/680; 438/788; 438/690; 134/1.1; 134/1.2; 134/1.3; 134/2; 156/345.29; 156/345.33

(58) Field of Classification Search .............. 700/117, 700/119, 121, 123; 427/96.8, 97.1, 248.1; 438/678–680, 788, 690; 134/1.1, 1.2, 1.3, 134/2; 156/345.29, 345.33
See application file for complete search history.

(56) References Cited

U.S. PATENT DOCUMENTS

| 6,457,478 B1 * | 10/2002 | Danese ..................... 134/1.3 |
| 6,465,372 B1 * | 10/2002 | Xia et al. .................. 438/787 |
| 6,486,061 B1 * | 11/2002 | Xia et al. .................. 438/680 |
| 6,513,537 B1 * | 2/2003 | Orii et al. .................. 134/1.2 |
| 6,620,670 B2 * | 9/2003 | Song et al. ................. 438/216 |
| 6,869,499 B2 * | 3/2005 | Toshima et al. .......... 156/345.29 |
| 2001/0024767 A1 * | 9/2001 | Toshima et al. ............. 430/313 |
| 2002/0045008 A1 * | 4/2002 | Toshima et al. ........... 427/248.1 |
| 2002/0185225 A1 * | 12/2002 | Toshima et al. ......... 156/345.33 |
| 2003/0119318 A1 * | 6/2003 | Niuya et al. ............... 438/690 |
| 2003/0170949 A1 * | 9/2003 | Chouno et al. ............ 438/200 |
| 2006/0196527 A1 * | 9/2006 | Nishimura et al. ........... 134/2 |
| 2007/0074747 A1 * | 4/2007 | Toshima et al. ............ 134/201 |

FOREIGN PATENT DOCUMENTS

JP   2002-184741   6/2002

* cited by examiner

*Primary Examiner*—Ramesh B Patel
(74) *Attorney, Agent, or Firm*—Morrison & Foerster LLP

(57) ABSTRACT

A substrate processing method for removing a resist film from a substrate having the resist film formed thereon comprises maintaining the inner region of the chamber at a prescribed temperature by putting a substrate in a chamber, denaturing the resist film by supplying ozone and a water vapor in such a manner that ozone is supplied into the chamber while a water vapor is supplied into the chamber at a prescribed flow rate, the amount of ozone relative to the amount of the water vapor being adjusted such that the dew formation within the chamber is prevented, and processing the substrate with a prescribed liquid material so as to remove the denatured resist film from the substrate.

11 Claims, 9 Drawing Sheets

COMPUTER READABLE STORAGE MEDIUM FOR CONTROLLING SUBSTRATE PROCESSING APPARATUS

BACKGROUND OF THE INVENTION

1. Field of the Invention

The present invention relates to a substrate processing method and a substrate processing apparatus for efficiently removing a resist film from a substrate having the resist film formed thereon, and a computer program, and a computer readable storage medium.

2. Description of the Related Art

In the manufacturing process of a semiconductor device, a circuit pattern is formed by mainly a so-called "photolithography process". The photolithography process includes, for example, the steps of forming a metal film on the surface of a semiconductor wafer by the PVD process or a CVD process, forming a resist film on the metal film, exposing the resist film to light in a prescribed pattern, followed by developing the light-exposed pattern formed in the resist film to form a circuit pattern made of the resist film, selectively etching the metal film with the resist film used as an etching mask to form a metal wiring pattern, and removing the resist film after formation of the metal wiring pattern.

Also, a so-called "damascene process" is widely employed for the manufacture of a semiconductor device comprising a multi-layered wiring. A single damascene process includes, for example, the steps of forming an interlayer insulating film on a substrate having a metal wiring formed thereon, forming a resist film on the interlayer insulating film, selectively exposing the resist film to light in a prescribed pattern, followed by developing the light-exposed resist film to form a circuit pattern made of the resist film, applying a plasma etching to the semiconductor wafer with the patterned resist film used as an etching mask to form vias and trenches in the interlayer insulating film, and removing the resist film after formation of the vias and the trenches.

A plasma ashing method is widely employed in the circuit-forming process described above as a method of removing the resist film from the semiconductor wafer having the resist film, which is adapted for, for example, the KrF line, formed thereon. In the plasma ashing method, however, a damage tends to be done to the underlying metal film. Also, the insulating film is likely to be excessively removed.

Such being the situation, Japanese Patent Disclosure (Kokai) No. 2002-184741 discloses a method that permits avoiding the difficulties pointed out above. To be more specific, disclosed in this prior art is a substrate processing method comprising the steps of processing the substrate with a gas containing ozone and a water vapor so as to denature the resist film such that the resist film is made soluble in water, and processing the substrate with a pure water so as to remove the denatured resist film from the semiconductor wafer.

However, the processing method disclosed in Japanese Patent Disclosure No. 2002-184741 quoted above is defective in that the peeling rate is low, compared with the plasma ashing process, with the result that a long processing time is required. It should be noted in this connection that a practical use of an ArF excimer laser as an exposure light source is being promoted in an attempt to make finer the circuit pattern. What should be noted is that the method disclosed in the patent document quoted above is incapable of peeling off the resist film adapted for the ArF line and the antireflection film that is used together with the resist film. Under the circumstances, it is unavoidable nowadays to employ the plasma ashing process that tends to do damage to the underlying layer.

BRIEF SUMMARY OF THE INVENTION

An object of the present invention is to provide a substrate processing method and a substrate processing apparatus, which permit improving the peeling rate of, for example, the resist film without plasma ashing.

Another object of the present invention is to provide a computer program for executing the substrate processing and to provide a storage medium having the computer program, which can be read by a computer, stored therein.

According to a first aspect of the present invention, there is provided a substrate processing method for removing a resist film from the substrate having the resist film formed thereon, comprising maintaining an inner region of a chamber housing a substrate having a resist film formed thereon at a prescribed temperature, denaturing the resist film by supplying ozone and a water vapor in such a manner that ozone is supplied into the chamber while a water vapor is supplied into the chamber at a prescribed flow rate, the amount of ozone relative to the amount of the water vapor being adjusted such that the dew formation within the chamber is prevented, and processing the substrate with a prescribed liquid material so as to remove the denatured resist film from the substrate.

In the substrate processing method of the present invention outlined above, a pure water or an alkaline aqueous solution is suitably used in removing the denatured resist film from the substrate in the case where a resist film adapted for the KrF line is used as the resist film. Where a resist film adapted for the KrF line, which is formed together with an antireflection film (BARC), is used as the resist film, it is desirable to use an alkaline aqueous solution in the step of removing the denatured resist film from the substrate. In this case, the antireflection film can be removed more easily. On the other hand, where a resist film adapted for the ArF line is used as the resist film, an alkaline aqueous solution is suitably used in removing the denatured resist film from the substrate. In general, an antireflection film is formed together with the resist film adapted for the ArF line. In the substrate processing method of the present invention, it is possible to denature the antireflection film in denaturing the resist film such that the antireflection film can be removed by the processing with an alkaline aqueous solution. The alkaline aqueous solution used for removing the denatured resist film from the substrate includes, for example, an APM aqueous solution, an aqueous solution of ammonium hydroxide, and an aqueous solution of tetramethyl ammonium hydroxide (TMAH). Particularly, where the metal is exposed to the processing surface of the substrate, it is possible to prevent the metal from being damaged by using any of an aqueous solution of ammonium hydroxide or an aqueous solution of TMAH.

A method of periodically stopping the ozone supply into the chamber is suitably employed in denaturing the resist film, which is included in the substrate processing method of the present invention. Also, in denaturing the resist film, the chamber is evacuated while introducing a water vapor and ozone into the chamber. In denaturing, the evacuation is controlled such that a prescribed positive pressure is maintained within the chamber. Further, it is desirable to obtain in advance the pressure at which dew is formed within the chamber when the inner region of the chamber is held at a prescribed temperature and the amount of the water vapor supplied into the chamber is set at a prescribed value. In this case, it is desirable to employ the method of controlling the supply amount of ozone while measuring the pressure inside the chamber in denaturing the resist film such that the measured pressure does not exceed the pressure at which dew is formed within the chamber.

According to a second aspect of the present invention, there is provided a substrate processing apparatus, comprising a chamber housing a substrate having a resist film formed thereon and equipped with a heating mechanism, a water vapor supply section for supplying a water vapor into the chamber, an ozone supply section for supplying ozone into the chamber, and a control section for executing a process for denaturing the resist film by supplying ozone and a water vapor in such a manner that ozone is supplied into the chamber with the inner region of the chamber housing the substrate retained at a prescribed temperature, while a water vapor is supplied into the chamber at a prescribed flow rate with the ozone supply amount being adjusted relative to the amount of the water vapor such that dew is not formed within the chamber.

According to a third aspect of the present invention, there is provided a substrate processing apparatus, comprising a chamber housing a substrate having a resist film formed thereon and equipped with a heating mechanism, a water vapor supply section for supplying a water vapor into the chamber, an ozone supply section for supplying ozone into the chamber, a liquid process section for supplying a prescribed process solution onto the substrate for carrying out a liquid processing, and a control section for executing a process for denaturing the resist film by supplying ozone and a water vapor in such a manner that ozone is supplied into the chamber housing the substrate retained at a prescribed temperature while a water vapor is supplied into the chamber at a prescribed flow rate with the ozone supply amount being adjusted relative to the amount of the water vapor such that dew is not formed within the chamber, and for executing, and for executing a process for removing the denatured resist film formed on the substrate with the process liquid.

According to a fourth aspect of the present invention, there is provided a computer program containing a software which, when executed, causes a computer to control a substrate processing apparatus in which a substrate housed in a chamber is processed with a water vapor and ozone, the software causing the computer to execute a process which comprises maintaining an inner region of the chamber housing a substrate having a resist film formed thereon at a prescribed temperature, denaturing the resist film by supplying ozone and a water vapor in such a manner that ozone is supplied into the chamber housing the substrate at a prescribed temperature while a water vapor is supplied into the chamber at a prescribed flow rate, the amount of ozone relative to the amount of the water vapor being adjusted such that a dew formation within the chamber is prevented.

According to a fifth aspect of the present invention, there is provided a computer program containing a software which, when executed, causes a computer to control a substrate processing apparatus, the software causing the computer to execute a substrate processing method to remove a resist film from the substrate comprising maintaining an inner region of the chamber housing a substrate having a resist film formed thereon at a prescribed temperature, denaturing the resist film by supplying ozone and a water vapor in such a manner that ozone is supplied into the chamber while a water vapor is supplied into the chamber at a prescribed flow rate, the amount of ozone relative to the amount of the water vapor being adjusted such that the dew formation within the chamber is prevented, and processing the substrate with a prescribed liquid material so as to remove the denatured resist film from the substrate.

According to a sixth aspect of the present invention, there is provided a storage medium that can be read by a computer, the storage medium containing a software which, when executed, causes a computer to control the substrate processing apparatus, the software causing the computer to execute a substrate processing method to remove a resist film from the substrate comprising maintaining an inner region of the chamber having a substrate having a resist film formed thereon at a prescribed temperature, denaturing the resist film by supplying ozone and a water vapor in such a manner that ozone is supplied into the chamber while a water vapor is supplied into the chamber at a prescribed flow rate, the amount of ozone relative to the amount of the water vapor being adjusted such that the dew formation within the chamber is prevented, and processing the substrate with a prescribed liquid material so as to remove the denatured resist film from the substrate.

DETAILED DESCRIPTION OF THE INVENTION

Some embodiments of the present invention will now be described in detail with reference to the accompanying drawings.

Figure 1:
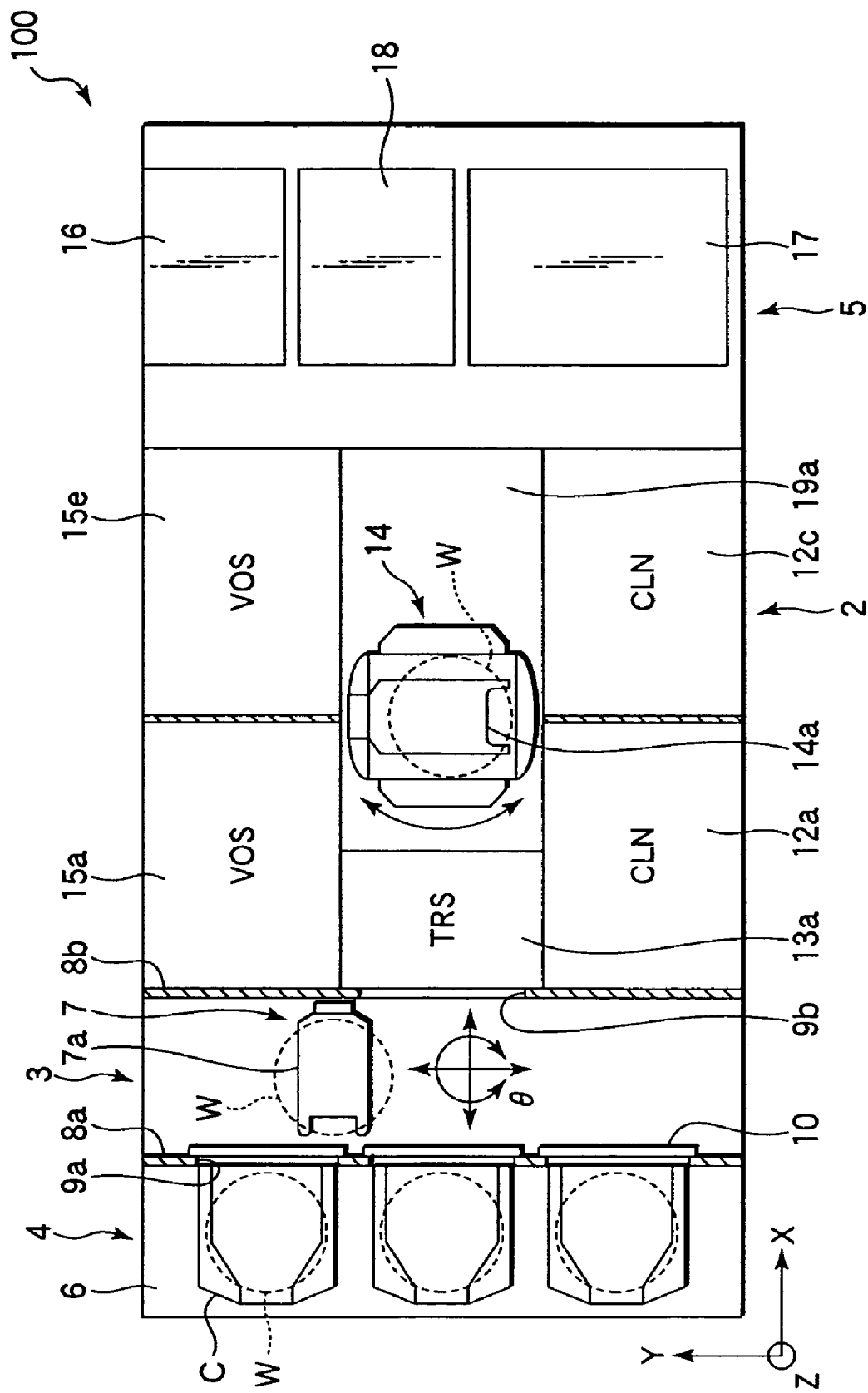
FIG. 1 is a plan view schematically showing the construction of a resist film-removing apparatus including a film-denaturing unit (VOS) according to one embodiment of the substrate processing apparatus of the present invention.
Figure 2:
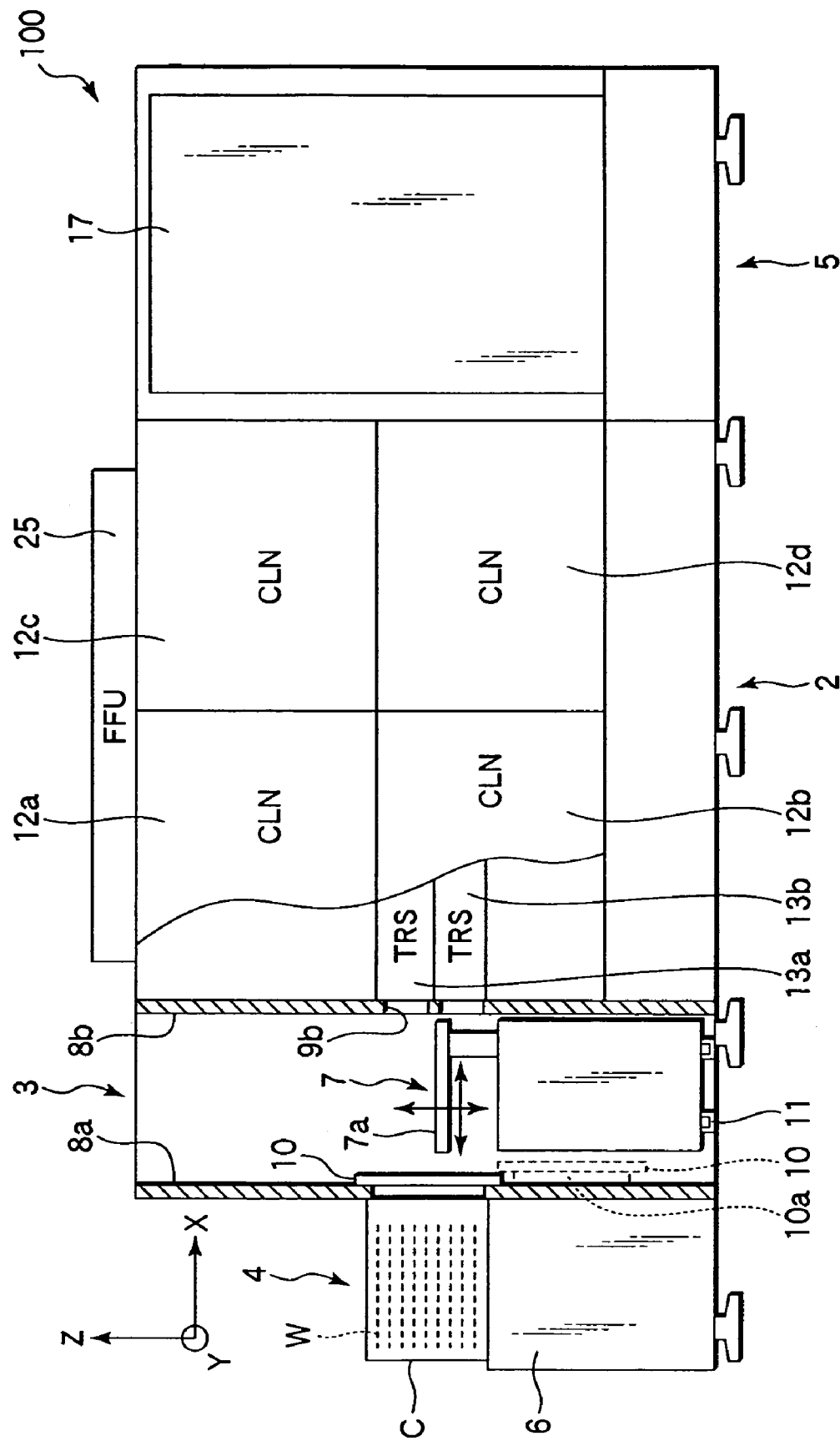
FIG. 2 is a front view schematically showing the construction of the resist film-removing apparatus.
Figure 3:
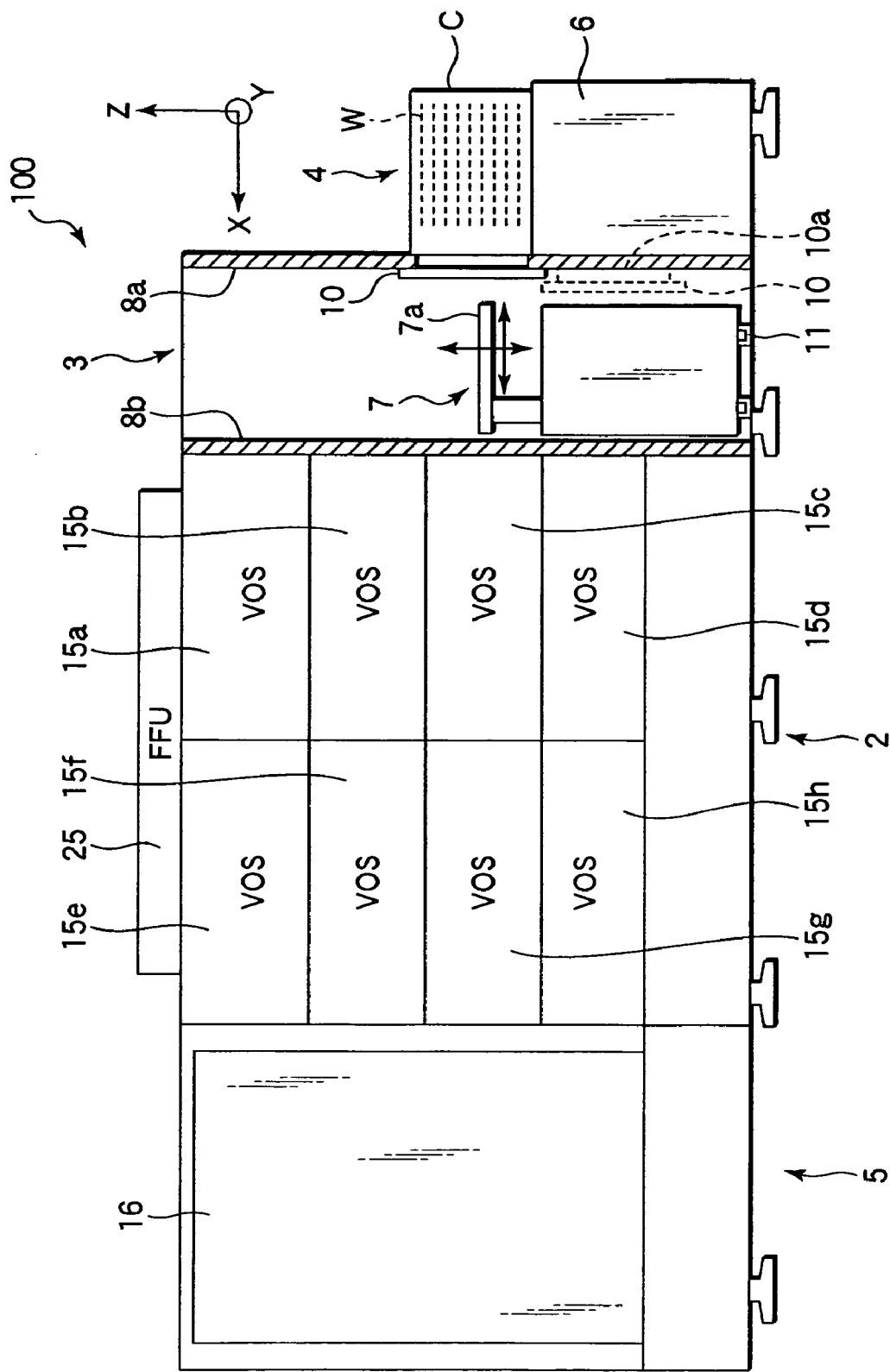
FIG. 3 is a back view schematically showing the construction of the resist film-removing apparatus.

FIG. 1 is a plan view schematically showing the construction of a resist film-removing apparatus 100 including a film-denaturing unit (VOS) according to one embodiment of the substrate processing apparatus of the present invention; FIG. 2 is a front view showing the construction of the resist film-removing apparatus shown in FIG. 1, and FIG. 3 is a back view showing the construction of the resist film-removing apparatus shown in FIG. 1.

As shown in the drawings, the resist film-removing apparatus 100 comprises a carrier station 4 into which a carrier housing a wafer W is transferred from another process unit and from which a carrier housing a processed wafer is transferred to another process unit for allowing the wafer to be subjected to the next process, a process station 2 including a plurality of units for applying a denaturing processing and a liquid processing to a resist film, a transfer station 3 for transferring the wafer W between the process station 2 and the carrier station 4, and a chemical station 5 for preparing and storing a chemical liquid, a pure water, a gas, etc. used in the process station 2.

Wafers W are housed a prescribed distance apart from each other in the vertical direction (Z-direction) within a carrier C such that the wafers W assume a horizontal posture within the carrier C. The wafer W is transferred into and out of the carrier C through one side wall of the carrier C. The side wall of the carrier C noted above can be opened or closed by a lid 10*a*. FIGS. 2 and 3 show the state that the lid 10*a* is moved downward so as to open the side wall of the carrier C.

As shown in FIG. 1, the carrier station 4 includes a table 6 on which the carriers C can be disposed at three positions apart from each other in the Y-direction in the drawing. The carrier C is disposed on the table 6 such that the side wall of the carrier C that can be closed by the lid 10*a* is allowed to face a boundary wall 8*a* between the carrier station 4 and the transfer station 3. A window section 9*a* is formed in that region of the boundary wall 8*a* which corresponds to the position where the carrier C is disposed, and a shutter 10 serving to open/close the window section 9*a* is formed on the side of the transfer station 3 of each of the window sections 9*a*. The shutter 10 is provided with a holding means (not shown) for holding the lid 10*a* of the carrier C so as to permit the lid 10*a*, which is held by the holding means, to retreat toward the side of the transfer station 3.

A wafer transfer device 7, which is arranged in the transfer station 3, comprises a wafer transfer pick 7*a* capable of holding the wafer W. The wafer transfer device 7 is movable in the Y-direction along a guide 11 that is formed on the floor of the transfer station 3 in a manner to extend in the Y-direction. Also, the wafer transfer pick 7*a* is slidable in the X-direction, movable in the Z-direction, and swingable (θ swing) within the X-Y plane.

Because of the particular construction, the wafer transfer pick 7*a* is capable of gaining access to all the carriers C disposed on the table 6, capable of transferring the wafer W positioned at an arbitrary height within the carrier C from within the carrier C, and capable of transferring the wafer W into an arbitrary position within the carrier C under the state that the shutter 10 is retreated to permit the inner region of the carrier C to communicate with the transfer station 3 via the window section 9*a*.

The process station 2 comprises two wafer disposing units (TRS) 13*a*, 13*b* that are positioned on the side of the transfer station 3. The wafer disposing unit (TRS) 13*a* is used for the purpose of, for example, disposing thereon the wafer W when the wafer W is received from the transfer station 3, and the wafer disposing unit (TRS) 13*b* is used for disposing thereon the wafer W when the wafer W after completion of a prescribed processing is returned to the transfer station 3. Since a clean air is supplied from a fan filter unit (FFU) 25 into the process station 2 in a manner to form a down flow, it is possible to suppress the contamination of the wafer W by disposing the wafer W processed in the process station 2 on the wafer disposing unit (TRS) 13*a* on the upper stage.

A window section 9*b* is formed in that region of a boundary wall 8*b* between the transfer station 3 and the process station 2 which corresponds to the wafer disposing units (TRS) 13*a* and 13*b*. The wafer transfer pick 7*a* is capable of gaining access to the wafer disposing units (TRS) 13*a*, 13*b* via the window section 9*b* so as to transfer the wafer W between the carrier C and the wafer disposing units (TRS) 13*a*, 13*b*.

Film-denaturing units (VOS) 15*a* to 15*h* for denaturing the resist film by the molecules of a process gas containing ozone and a water vapor are arranged on the back side of the process station 2. The denaturation of the resist film denotes the processing to make the resist film remaining on the wafer soluble in a prescribed liquid material. Incidentally, if a wafer W bearing a polymer residue is processed with a process gas specified in the present invention, the polymer residue is denatured so as to be made soluble in water. Also, the residue of an ArF resist after the patterning process is made soluble in an alkaline aqueous solution.

Figure 4:
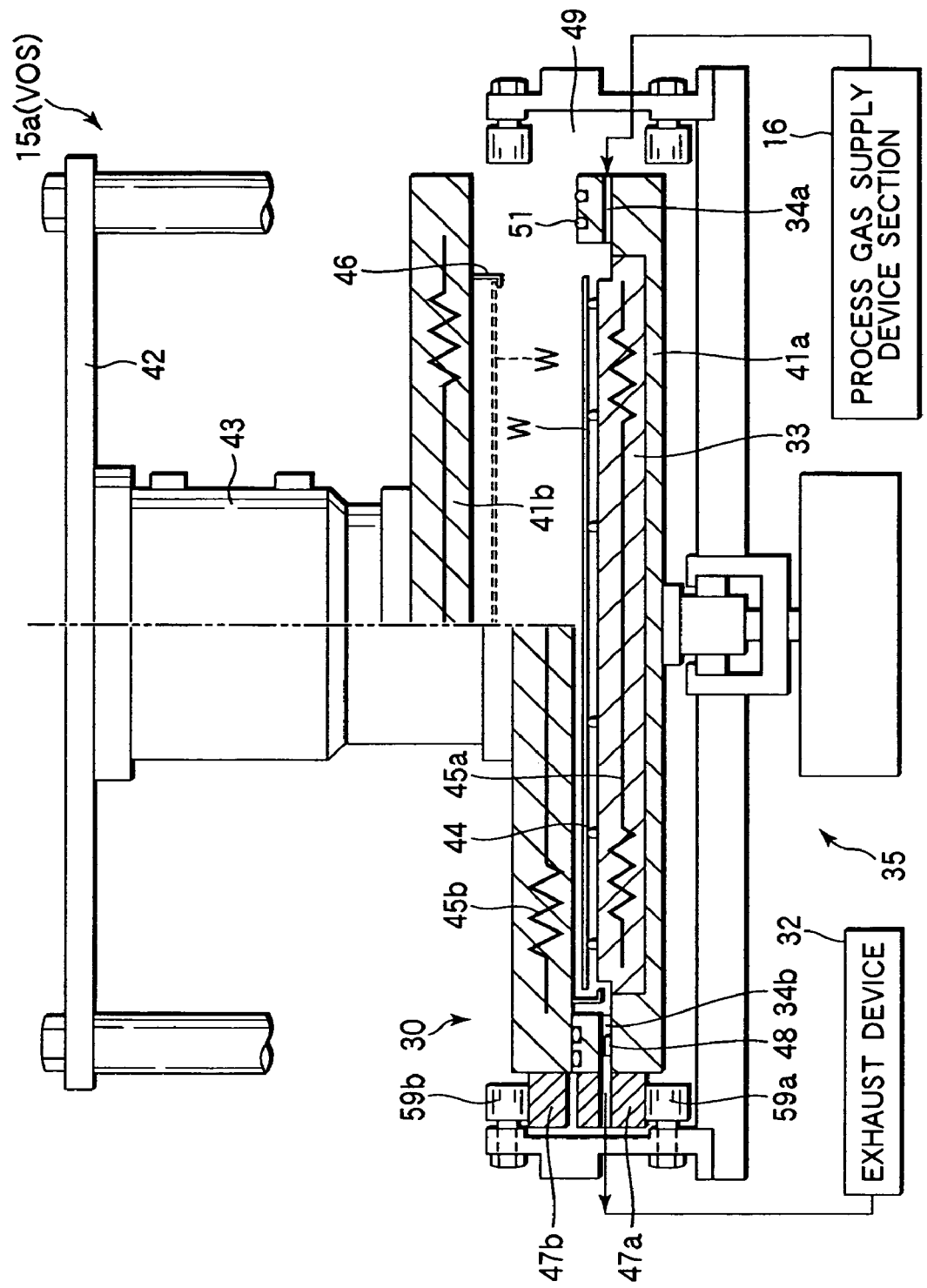
FIG. 4 is a cross sectional view schematically showing the construction of a film-denaturing unit (VOS) according to one embodiment of the substrate processing apparatus of the present invention, which is mounted to a resist film-removing apparatus.

FIG. 4 is a cross sectional view schematically showing the construction of the film-denaturing unit (VOS) 15*a*. As shown in the drawing, the film-denaturing unit (VOS) 15*a* comprises a chamber 30 housing the wafer W. The chamber 30 comprises a stationary lower vessel 41*a*, and a lid 41*b* covering the upper surface of the lower vessel 41*a*. The lid 41*b* can be moved in the vertical direction by a cylinder 43 fixed to a frame 42.

An O-ring 51 is arranged on the upper surface in the rising section of the lower vessel 41*a*. If the lid 41*b* is moved downward by driving the cylinder 43, the periphery on the back surface of the lid 41*b* is allowed to abut against the upper surface of the rising section in the periphery of the lower vessel ~41*a*. At the same time, the O-ring 51 is compressed so as to form a closed processing space within the chamber 30.

A stage 33 on which the wafer W is disposed is formed within the lower vessel 41*a*, and a plurality of proximity pins 44 supporting the wafer W are arranged on the surface of the stage 33.

A heater 45*a* is buried in the stage 33 and another heater 45*b* is buried in the lid 41*b*. As a result, it is possible to maintain the stage 33 and the lid 41*b* at prescribed temperatures. In other words, it is possible to maintain the inner region of the chamber 30 at a prescribed temperature.

A claw member 46 for holding the wafer W is arranged at three points on the back surface of the lid 41*b*, though the drawing shows that the wafer W is held at two points alone. A wafer transfer arm 14*a* delivers the wafer W onto the claw member 46. If the lid 41*b* is moved downward with the wafer W held by the claw member 46, the wafer W is delivered onto the proximity pins 44 arranged on the stage 33 during the downward movement of the lid 41*b*.

A gas introducing port 34*a* for introducing a process gas containing ozone and a water vapor into the chamber 30 and a gas discharge port 34*b* for discharging the process gas to the outside are formed in the lower vessel 41*a* such that the process gas flows within the chamber 30 substantially in the horizontal direction.

A process gas supply device section 16 connected to the gas introducing port 34*a* of the chamber 30 and serving to supply the process gas containing ozone and a water vapor into the chamber 30 comprises an ozone generating device for converting an oxygen gas into ozone, a nitrogen gas supply line for supplying a nitrogen gas for purging the inner region of the chamber 30 after denaturing the resist film, and a water vapor generating device for evaporating a pure water so as to generate a water vapor. If the ozone supply is stopped, the water vapor alone is supplied into the chamber 30 of each of the film-denaturing units (VOS) 15*a* to 15*h*.

An exhaust device 32 connected to the gas discharge port 34*b* for evacuating the chamber 30 comprises a device for the compulsory evacuation such as a vacuum pump or an aspirator and a variable valve for controlling the flow rate of the gas discharged from within the chamber 30. In order to maintain a positive pressure within the chamber 30 under the state that a gas is consecutively supplied into the chamber 30, it suffices to control the pressure by operating the variable valve alone without driving, for example, the vacuum pump.

Incidentally, FIG. 4 shows that the gas introducing port 34a and the gas discharge port 34b are positioned lower than the wafer W disposed on the proximity pins 44. However, it is also possible for the gas introducing port 34a and the gas discharge port 34b to be positioned higher than the wafer W disposed on the proximity pins 44.

A pressure sensor 48 for measuring the exhaust pressure, which is equal to the pressure inside the chamber 30, is mounted to the gas discharge port 34b formed in the chamber 30. Needless to say, the mounting position of the pressure sensor 48 is not limited to the portion shown in the drawing, and can be mounted to a desired position as far as it is possible to measure the inner pressure of the chamber 30.

As described hereinlater, it is desirable for the wafer W to be treated with a process gas under the state that a prescribed positive pressure is maintained inside the chamber 30. Such being the situation, in order to prevent the process gas from leaking from within the chamber 30 to the outside through the clearance between the lower vessel 41a and the lid 41b, the lower vessel 41a and the lid 41b are hermetically brought into contact with each other by fastening projecting sections 47a and 47b formed on the edge surfaces of the lower vessel 41a and the lid 41b, respectively, by operating a lock mechanism 35. In other words, the process gas can be prevented from leaking from within the chamber 30 to the outside without depending solely on the pushing force of the cylinder 43.

The projecting sections 47a, 47b are arranged in, for example, four positions equidistantly apart from each other in a manner to overlap with each other in the vertical direction such that a clearance section 49 is formed between the adjacent mounting positions of the projecting sections 47a, 47b. Incidentally, the clearance section 49 is shown in the right edge portion in FIG. 4. The projecting sections 47a and 47b are held between rollers 59a and 59b included in the lock mechanism 35 so as to bring the lower vessel 41a and the lid 41b into a hermetic contact with each other. Under the state that the rollers 59a, 59b are moved to the position of the clearance section 49, the lid 41b can be moved freely in the vertical direction.

The film-denaturing units (VOS) 15b to 15h have a same structure of the film-denaturing unit (VOS) 15a.

The wafer W after completion of the processing in the film-denaturing units (VOS) 15a to 15h is processed with a prescribed liquid material in the cleaning units (CLN) 12a to 12d, which are arranged on the side of the front surface of the process station 2, so as to dissolve and remove the denatured resist film. The wafer W transferred from the film-denaturing units (VOS) 15a to 15h is further cleaned and dried in the cleaning units (CLN) 12a to 12d.

Figure 5:
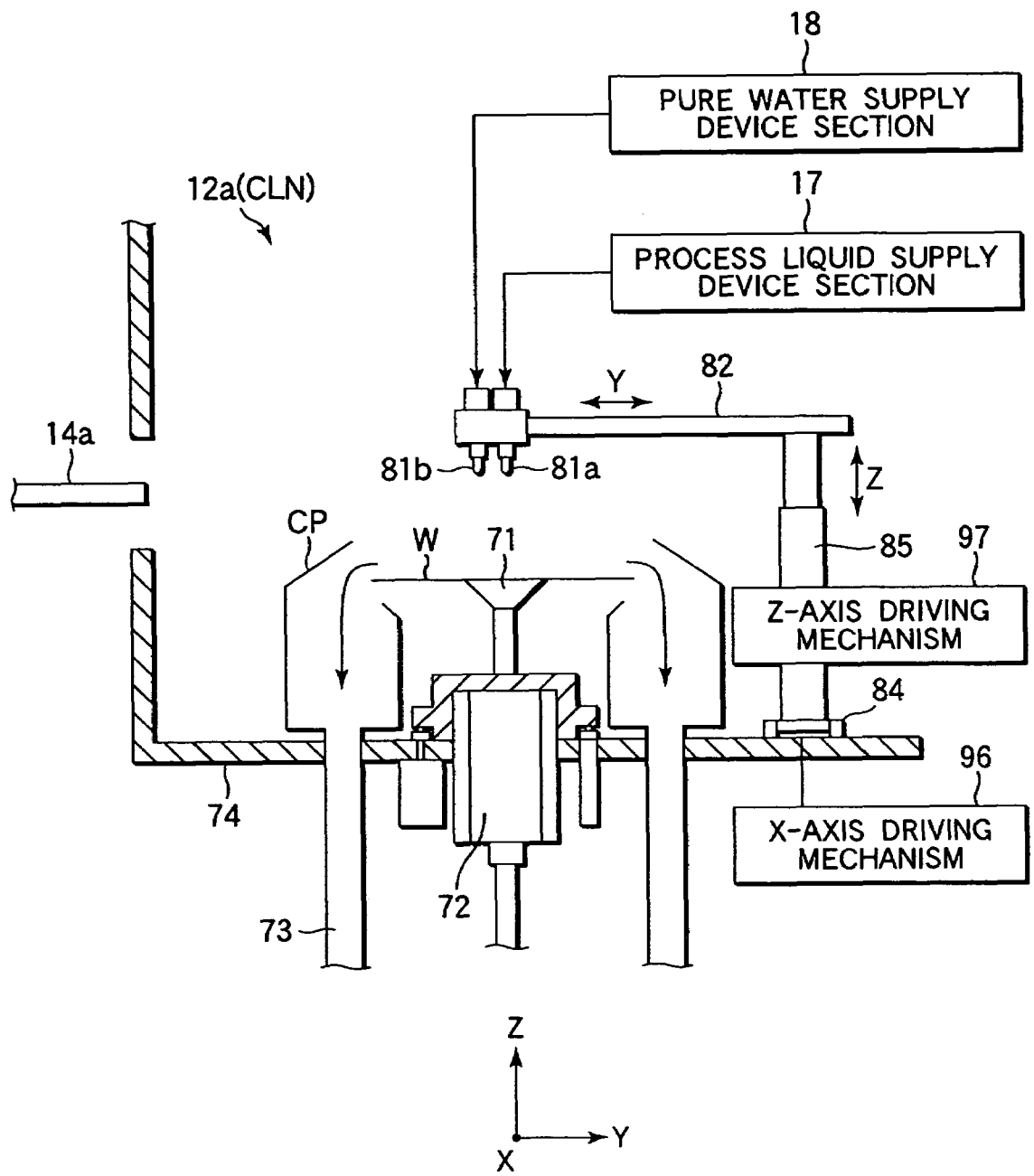
FIG. 5 is a cross sectional view schematically showing the construction of a cleaning unit (CLN) mounted to the resist film-removing apparatus.

FIG. 5 is a cross sectional view schematically showing the construction of the cleaning unit (CLN) 12a. As shown in the drawing, an annular cup (CP) is arranged in the central portion of the cleaning unit (CLN) 12a, and a spin chuck 71 is arranged inside the annular cup (CP). The spin chuck 71 is rotated by a driving motor 72 under the state that the wafer W is held by the spin chuck 71 by the vacuum suction. A drain pipe 73 for discharging the chemical liquid, cleaning liquid and a pure water is formed to extend through the bottom wall of the annular cup (CP).

The cleaning unit (CLN) 12a comprises a process liquid nozzle 81a for supplying an alkaline aqueous solution onto the surface of the wafer W held by the spin chuck 71, a pure water nozzle 81b for supplying a pure water onto the surface of the wafer W held by the spin chuck 71, and a gas nozzle (not shown) for spurting a drying gas onto the wafer W held by the spin chuck 71.

The process liquid nozzle 81a and the pure water nozzle 81b are held by a scan arm 82. The scan arm 82 is mounted to the upper edge section of a vertical support member 85 that is movable in the horizontal direction on a guide rail 84 arranged to extend in the X-direction on a unit bottom plate 74. An X-axis driving mechanism 96 permits the scan arm 82 to be interlocked with the vertical support member 85 so as to be moved in the X-direction. Also, the scan arm 82 is shrinkable in the Y-direction and can be moved in the vertical direction (Z-direction) by a Z-axis driving mechanism 97. It follows that the process liquid nozzle 81a and the pure water nozzle 81b are movable between prescribed positions above the wafer W and other prescribed positions outside the cup (CP). Incidentally, the gas nozzle (not shown) is also movable like, for example, the process liquid nozzle 81a.

The alkaline aqueous solution discharged from the process liquid nozzle 81a includes, for example, an APM aqueous solution (i.e., a mixed solution of ammonium hydroxide ($NH_4OH$)-hydrogen peroxide ($H_2O_2$)-water ($H_2O$)), an aqueous solution of ammonium hydroxide (or an ammonia water), and an aqueous solution of tetramethyl ammonium hydroxide (TMAH). These alkaline aqueous solutions are used suitably in the case where a resist film adapted for the ArF line and an antireflection film used together with the resist film are removed from the wafer W.

The cleaning units (CLN) 12b to 12d have a same structure of the cleaning unit 12a.

A main wafer transfer device 14 for transferring the wafer W within the process station 2 is arranged substantially in the central portion of the process station 2. The main wafer transfer device 14 is rotatable about the Z-axis. Also, the main wafer transfer device 14 comprises the wafer transfer arm 14a for transferring the wafer W. The wafer transfer arm 14a is movable back and forth in the horizontal direction and movable in the Z-direction. Because of the particular construction of the wafer transfer arm 14a, the main wafer transfer device 14 is capable of gaining access to each of the process units arranged in the process station 2 so as to transfer the wafer W among the process units arranged in the process station 2. Further, as shown in FIGS. 2 and 3, the fan filter unit (FFU) 25 for blowing a clean air into the process station 2 is arranged in the upper region of the process station 2.

Arranged in the chemical station 5 are a process gas supply device section 16 for supplying ozone and a water vapor into the film-denaturing units (VOS) 15a to 15h, a process liquid supply device section 17 for storing/supplying the alkaline aqueous solution used in the cleaning units (CLN) 12a to 12d, and a pure water supply device section 18 for supplying a pure water into the cleaning units (CLN) 12a to 12d.

Figure 6:
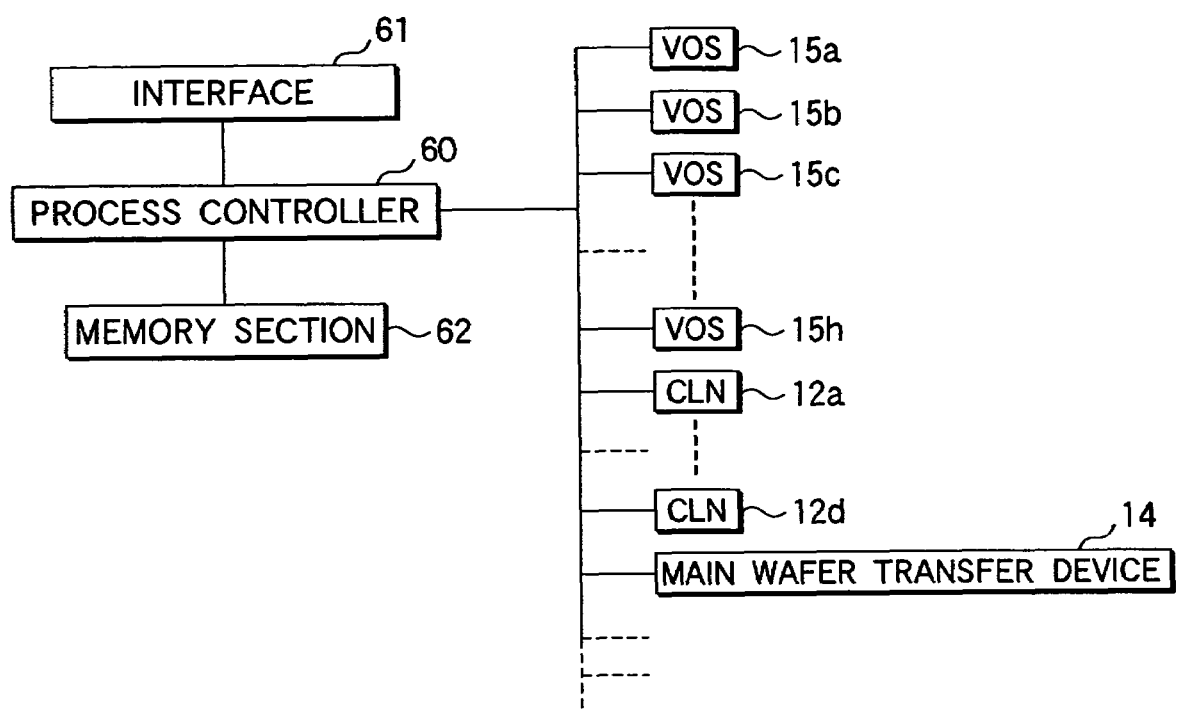
FIG. 6 is a block diagram showing the construction of a control system included in the resist film-removing apparatus.

FIG. 6 shows the control system of the resist film-removing apparatus 100. Incidentally, all the constituents of the resist film-removing apparatus 100 are not shown in FIG. 6, and the main constituents alone that are arranged in the process station 2 are shown in FIG. 6. Each constituent of the resist film-removing apparatus 100 is connected to a process controller 60 so as to be controlled by the process controller 60. An interface 61 is connected to the process controller 60. The interface 61 is equipped with a key board that is operated by the process supervisor for performing, for example, the command input operation so as to supervise the resist film-removing apparatus 100, and is also equipped with, for example, a display for visually displaying the operating state of the resist film-removing apparatus 100.

Further, a memory section 62 is also connected to the process controller 60. The memory section 62 stores the control program for realizing each of the process conditions executed by the resist film-removing apparatus 100 under the control by the process controller 60, and also stores the recipe recording, for example, the data of the process conditions. The process recipe for executing the processing in, for example, the film-denaturing units (VOS) 15a to 15h includes the data on the temperature set for the chamber 30, the flow rate, time and discharge flow rate of the nitrogen gas used for purging the inner region of the chamber 30, the pressure held within the chamber 30, the flow rate and supplying time of a water vapor supplied into the chamber 30, and the flow rate and supplying time of ozone supplied into the chamber 30.

An arbitrary recipe is read, as desired, from the memory section 62 under, for example, the instruction from the user interface 61 so as to be executed by the process controller 60, with the result that a desired processing is carried out in the resist film-removing apparatus 100 under the control by the process controller 60.

The process method for removing the resist film formed on the wafer W will now be described.

First of all, a first method of removing the resist film will now be described.

Figure 7:
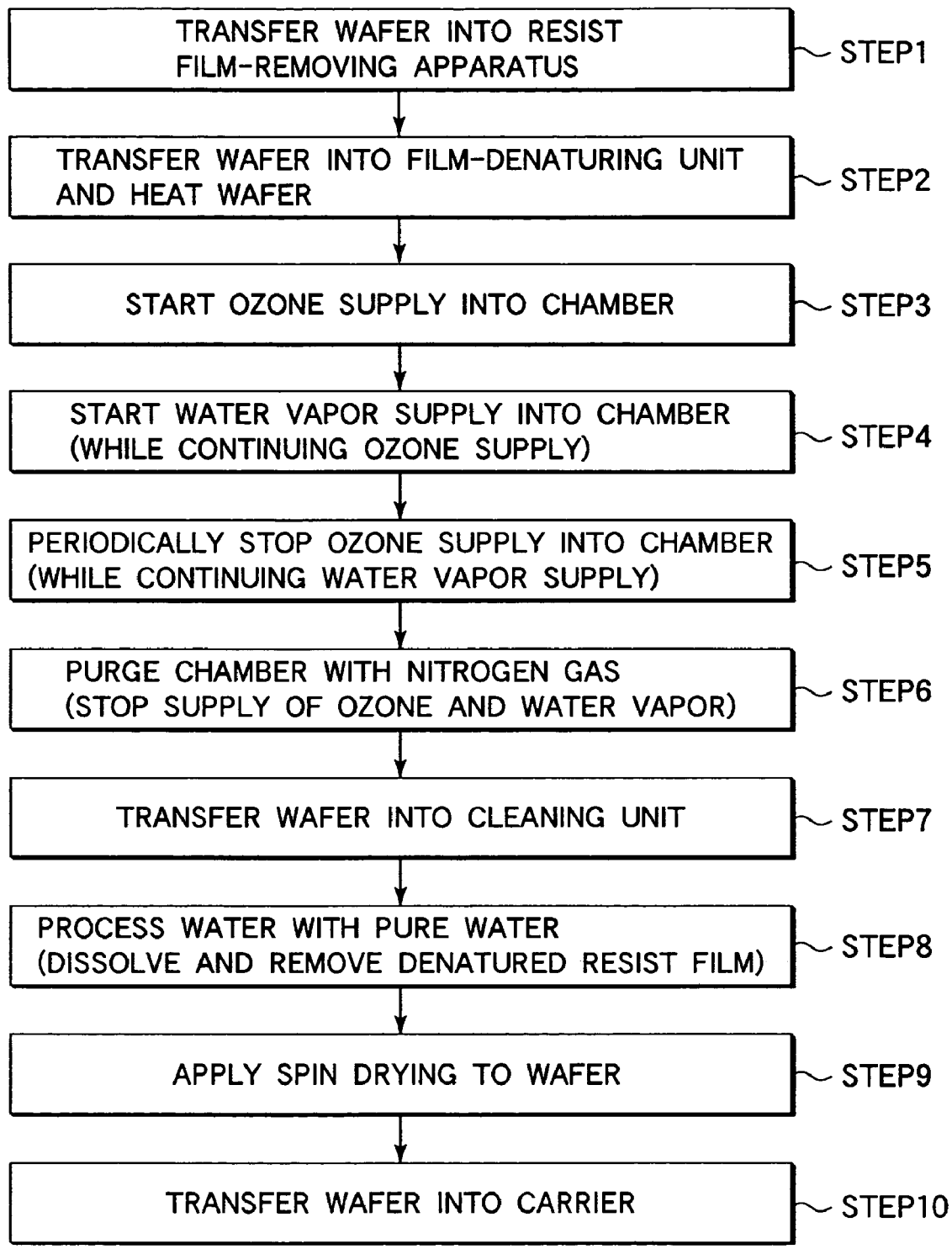
FIG. 7 is a flow chart showing a first removing method of a resist film.

FIG. 7 is a flow chart showing the first method of removing the resist film. The first removing method is suitably employed in the case where the resist film is formed of a resist adapted for an i-line or a resist adapted for the KrF line.

In the first step, the wafer W is housed in the carrier C and transferred into the resist film-removing apparatus 100 (step 1). The wafer W is transferred into the resist film-removing apparatus 100 in order to remove the resist pattern after the etching applied to a metal film with the resist pattern used as a mask. It is also possible for the plasma etching to be applied to an interlayer insulating film such as a low-k film with the resist pattern used as a mask for forming a wiring trench of a damascene structure. The wafer W is transferred into the resist film-removing apparatus 100 in this case, too, in order to remove the resist pattern after the plasma etching. Then, the process supervisor performs, for example, the information input operation for processing the wafer W in the resist film-removing apparatus 100 so as to start the processing of the wafer W.

After transferred by the wafer transfer device 7 into the wafer disposing unit (TRS) 13b, the wafer W is transferred by the main wafer transfer device 14 into any of the film-denaturing units 15a to 15h (step 2).

To be more specific, the transfer of the wafer W into, for example, the film-denaturing unit (VOS) 15a is carried out as follows. In the first step, the lid 41b of the chamber 30 is retreated to a position above the lower vessel 41a. Under this condition, the wafer transfer arm 14a holding the wafer W is moved into the chamber 30 so as to permit the wafer W to be moved onto a position slightly higher than the horizontally protruding portion of the claw member 46 mounted to the lid 41b, i.e., that portion of the claw member 46 which holds the wafer W. Then, the wafer transfer arm 14a is moved downward so as to deliver the wafer W onto the claw member 46. Further, if the lid 41b is moved downward after the wafer transfer arm 14a is retreated from, for example, the film-denaturing unit (VOS) 15a, the wafer W is delivered from the claw member 46 onto the proximity pins 44 during the downward movement of the lid 41b, and the lid 41b is brought into a tight contact with the lower vessel 41a. Still further, the chamber 30 is hermetically closed by the lock mechanism 35.

The heaters 45a and 45b mounted to the chamber 30 are kept operated so as to heat the wafer W. In the substrate processing apparatus, the temperature of the lid 41b is set higher than the temperature of the stage 33 by a prescribed temperature. As a result, when a water vapor is supplied subsequently into the chamber 30, the density of the water vapor within the chamber 30 is made higher on the side of the stage 33 than on the side of the lid 41b so as to permit the water vapor to collide efficiently against the wafer W.

When the temperature distribution on the wafer W has been made substantially uniform, the supply of a nitrogen gas into the chamber 30 is stopped, followed by supplying ozone into the chamber 30 at a prescribed flow rate, and the inner pressure of the chamber 30 is increased (step 3). Then, a water vapor is supplied into the chamber 30 at a prescribed flow rate while supplying ozone into the chamber 30 at a prescribed flow rate (step 4). As a result, the molecules of ozone and water attack the carbon atoms constituting the resist film (carbon atoms of the resist material), thereby denaturing the resist film such that the resist film is made soluble in water.

In step 4, the exhaust amount from the chamber 30 is controlled so as to prevent the dew formation within the chamber 30 and to maintain constant the inner pressure of the chamber 30. If dew is formed on the surface of the wafer W, the resist begins to be dissolved by the water at the portion where a water droplet is generated by the dew formation, with the result that the resist is denatured nonuniformly so as to give rise to a resist residue.

To be more specific, the dew formation is prevented as follows. First of all, obtained is the pressure at which dew is formed within the chamber 30 under the conditions that the inner region of the chamber 30 is kept at a prescribed temperature and that the amount of the water vapor supplied into the chamber 30 is set constant. The process pressure is set lower than the pressure value thus obtained, and the information on the pressure is added to the information given in the recipe. Under the particular state, the process controller 60 serves to control the exhaust flow rate from within the chamber 30 with reference to the measured value of the pressure sensor 48 such that the pressure inside the chamber 30 does not exceed the pressure at which dew is formed and that the set pressure value is maintained.

Next, the state that a large number of water molecules are present inside the chamber 30 is periodically generated by periodically stopping the ozone supply into the chamber 30 while continuing the supply of the water vapor into the chamber 30 (step 5). For example, the ozone supply into the chamber 30 is continued for 15 seconds, followed by stopping the ozone supply, the ozone supply being kept stopped for 5 seconds and, then, the ozone supply is started again. The particular operation is repeated a plurality of times in accordance with the properties of the resist material. In step 5, the total amount of the gas periodically supplied into the chamber 30 is changed. However, since the exhaust flow rate from within the chamber 30 is controlled with reference to the measured value of the pressure sensor 48, the pressure inside the chamber 30 is kept constant.

A resist film was formed on each of two wafers W by using the same resist material. These two wafers W were processed under the same process conditions, except that one wafer W was processed by the method that the ozone supply was periodically stopped as described above, and the other wafer W was processed by the method that ozone was supplied continuously, so as to permit the resist film to be removed completely by the subsequent water cleaning. The process time required for the resist film to be removed completely was measured, with the result that the process time required in the method of periodically stopping the ozone supply was found to be not longer than 80% of the process time required in the method of continuously supplying ozone. It is considered reasonable to understand that, in the method of periodically stopping the ozone supply into the chamber 30, an atmosphere under which a large number of water molecules are present is generated and, thus, the resist film is denatured in a large number of portions so as to shorten the process time required for removing completely the resist film in the subsequent water cleaning. In the method of periodically stopping the ozone supply, it is possible to obtain the effect of preventing the difficulty generated under the state that a large amount of the water vapor is kept present inside the chamber 30, i.e., the difficulty that dew tends to be formed. It is also possible to obtain the effect of supplying ozone required for the denaturation of the resist film into the chamber 30 so as to prevent the deficiency of ozone required for the denaturation of the resist film.

In view of the effect of preventing the dew formation, it is desirable for the processing in step 5 to be finished under the state that the amount of the water vapor present inside the chamber 30 is small. Such being the situation, the supply of both ozone and the water vapor is stopped after ozone and the water vapor were supplied into the chamber 30 for a prescribed period of time and, at the same time, a nitrogen gas is introduced into the chamber 30 so as to purge the chamber 30 with the nitrogen gas (step 6).

If a large amount of the nitrogen gas is supplied into the chamber 30 in step 6, dew tends to be generated by the rapid change in pressure inside the chamber 30. Under the circumstances, it is desirable to set the nitrogen gas flow rate at a relatively small value in the initial stage and, then, to increase the nitrogen gas flow rate into the chamber 30 and to increase the exhaust flow rate after a prescribed amount of the nitrogen gas is supplied into the chamber 30. The particular operation makes it possible to shorten the purging time with the nitrogen gas. Incidentally, in step 6, ozone is completely discharged from within the exhaust device 32, too, in order to prevent an ozone-containing gas from flowing backward from the exhaust device 32 and, thus, to prevent ozone from being discharged from within the chamber 30 when the chamber 30 is opened later.

After completion of the processing in step 6, the resist film is denatured so as to be made soluble in water. However, the resist film is not peeled off from the wafer W. Therefore, in order to carry out a water cleaning for removing the resist film from the wafer W, the wafer W is transferred from any one of the film-denaturing units (VOS) 15a to 15h into any one of cleaning units 12b to 12d (step 7).

The transfer of the wafer W in step 7 is carried out as follows. Specifically, after completion of the purging inside the chamber 30 with a nitrogen gas, it is confirmed that the inner pressure of the chamber 30 is equal to the outer pressure. It should be noted that, if the chamber 30 is opened under the state that the inner pressure of the chamber 30 is higher than the atmospheric pressure, the chamber 30 tends to be damaged. After confirmation of the inner pressure of the chamber 30, the fastened state between the lower vessel 41a and the lid 41b, which is achieved by the lock mechanism 35, is released so as to move upward the lid 41b. When the lid 41b is moved upward, the wafer W held by the claw member 46 is also moved upward together with the lid 41b. Then, the wafer transfer arm 14a is moved into the clearance between the lower vessel 41a and the lid 41b so as to deliver the wafer W from the claw member 46 onto the wafer transfer arm 14a. The wafer transfer arm 14a holding the wafer W delivers the wafer W onto the spin chuck 71 arranged within any one of the cleaning units (CLN) 12a to 12d.

A pure water is supplied from the pure water nozzle 81b onto the surface of the wafer W transferred into any one of the cleaning unit (CLN) 12a to 12d and held substantially in the horizontal posture (step 8). As a result, that portion of the resist film which was denatured so as to be made soluble in water is removed from the surface of the wafer W.

As described previously, each of the cleaning units (CLN) 12a to 12d includes the process liquid nozzle 81a. However, the process liquid nozzle 81a is not used in this example. The control to apply first the processing with a pure water to the wafer W transferred into the cleaning unit (CLN) 12a can be automatically performed by selecting the recipe storing the instruction to start the operation with the processing with a pure water in conformity with the resist material when the process supervisor performs the information input operation for processing the wafer W in the resist film-removing apparatus 100. Alternatively, it is also possible for the process supervisor to select that recipe alone which stores the instruction to start the operation with the processing with a pure water when the process supervisor designates the resist material, with the result that the processing with a pure water is applied first to the wafer W.

Step 8 is directed to the processing with a pure water. After the processing in step 8, it is desirable to apply a rinsing processing to the wafer W by scanning the pure water nozzle 81b in, for example, the radial direction of the wafer W while rotating the wafer W. After completion of the processing in step 8 or the rinsing processing after step 8, the wafer W is rotated at a high speed so as to subject the wafer W to a spin drying (step 9). It is possible to perform the spin drying while supplying a drying gas onto the wafer W.

The wafer W having the resist film removed therefrom by the processing in any of cleaning units (CLN) 12a to 12d is transferred into the wafer disposing unit (TRS) 13a and, then, transferred by the wafer transfer device 7 so as to be housed in a prescribed position within the carrier C (step 10).

A second method of removing the resist film by using the resist film-removing apparatus 100 will now be described with reference to the flow chart shown in FIG. 8. The second removing method is suitably employed in the case where the films to be removed are a resist film adapted for the ArF line and an antireflection film (BARC) that is formed together with the resist film.

Figure 8:
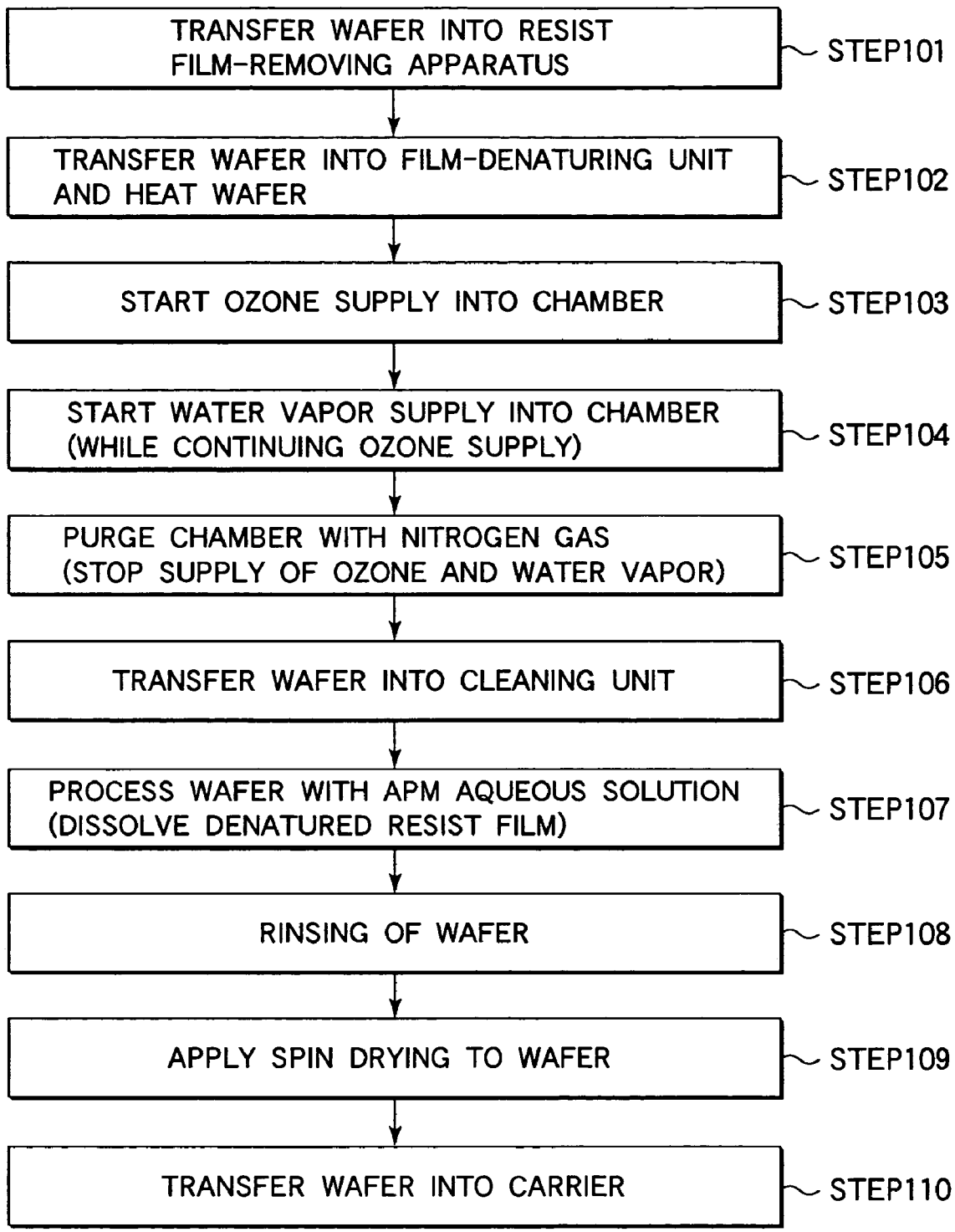
FIG. 8 is a flow chart showing a second removing method of a resist film.

Steps 101 to 103 shown in FIG. 8 are equal to steps 1 to 3 shown in FIG. 7 in conjunction with the first removing method described above and, thus, the detailed description of steps 101 to 103 is omitted. Under the state of step 103, i.e., under the state that the wafer W is housed in the chamber 30 and kept at a prescribed temperature, and that ozone is supplied at a prescribed flow rate into the chamber 30, a water vapor is further supplied into the chamber 30 at a prescribed flow rate and retained in the chamber 30 for a prescribed period of time (step 104).

In step 104, the pressure inside the chamber 30 is controlled so as not to give rise to the dew formation within the chamber 30 as in steps 4 and 5 included in the first removing method described previously. It should be noted in this connection that the resist film adapted for the ArF line is not easily dissolved in a pure water even if the denaturing process proceeds in step 104, with the result that, if a water droplet is generated, that portion of the resist film which is positioned immediately below the water droplet is not denatured so as to give rise to the presence of a resist residue after the subsequent step of the processing with an alkaline aqueous solution.

After completion of step 104, the supply of ozone and a water vapor into the chamber 30 is stopped, followed by purging the inner region of the chamber 30 with a nitrogen gas (step 105) as in steps 6 and 7 of the first method of removing the resist film described previously. Then, the wafer W is transferred from any one of the film-denaturing units (VOS) 15a to 15d into any one of the cleaning units (CLN) 12a to 12d (step 106).

In the case of an ArF resist film, a process liquid, e.g., an APM aqueous solution, is discharged from the process liquid nozzle 81a onto the surface of the wafer W transferred into any one of the cleaning unit (CLN) 12a to 12d and held substantially in the horizontal posture so as to form paddles on the wafer surface. A prescribed time later, the wafer W is rotated so as to remove centrifugally the APM aqueous solution from the surface of the wafer W, and the APM aqueous solution is further supplied onto the surface of the wafer W while rotating the wafer W (step 107). It is possible for the APM aqueous solution to have room temperature or to be warmed to about 70° C. It is desirable for the APM aqueous solution to be controlled at a temperature at which the dissolution of the resist material in the APM aqueous solution is promoted, if the dissolution of the resist material is dependent on the temperature of the process liquid. In this fashion, it is possible to remove the resist film and the antireflection film formed together with the resist film.

The control to operate first the process liquid nozzle 81a for applying the processing with an alkaline aqueous solution to the wafer W transferred into any one of the cleaning unit (CLN) 12a to 12d can be automatically performed by selecting the recipe storing the instruction to start the processing with an alkaline aqueous solution in conformity with the resist material when the process supervisor performs the information input operation for processing the wafer W in the resist film-removing apparatus 100 or by selecting that recipe alone which stores the instruction to start the processing with an alkaline aqueous solution when the process supervisor designates the resist material.

Where the films to be removed from the wafer W are a resist film adapted for the ArF line and the antireflection film that is formed together with the resist film, the resist film and the antireflection film are not removed from the wafer W even if the water cleaning is applied to the wafer W after the processing in any one of the film-denaturing units (VOS) 15a to 15h. It has also been clarified by another experiment that it is impossible to dissolve the denatured resist film adapted for the ArF line even if the wafer W is processed with an acidic aqueous solution such as a hydrogen peroxide solution or hydrochloric acid. However, it has been clarified that the films noted above can be dissolved if the wafer W is processed with an alkaline aqueous solution so as to make it possible to remove these films from the wafer W. It is considered reasonable to understand that the alkaline radicals such as $NH_4^+$ and $K^+$ contained in the alkaline aqueous solution are easily coupled with the molecules of the resist film denatured by ozone and the water vapor so as to permit the resist film to be dissolved in the alkaline aqueous solution. However, the amount of the hydroxyl groups contained in a pure water and an acidic aqueous solution is small, with the result that the pure water and the acidic aqueous solution are considered to be incapable of dissolving the denatured resist film.

It is possible to use as the alkaline aqueous solution an aqueous solution of ammonium hydroxide, i.e., a so-called ammonia water, and an organic alkaline aqueous solution such as a TMAH solution used for the developing of resist in place of the APM aqueous solution. Particularly, where a metal such as tungsten is exposed to the processing surface, it is necessary to select an alkaline aqueous solution that does not do damage to the metal in the processing in step 107. An aqueous solution of ammonium hydroxide and a TMAH solution are suitable for use as such an alkaline aqueous solution. It should be noted in this connection that the APM aqueous solution contains hydrogen peroxide, with the result that the metal incurs a damage.

Incidentally, the alkaline aqueous solution includes an inorganic alkaline aqueous solution such as an aqueous solution of sodium hydroxide, an aqueous solution of potassium hydroxide or an aqueous solution of sodium bicarbonate. It is certainly possible to dissolve and remove the denatured resist film adapted for the ArF line by using the inorganic aqueous solution referred to above. However, it is not practical to use such an inorganic alkaline aqueous solution because the metal ion adversely affects the device.

After completion of the processing with an APM aqueous solution in step 107, the wafer W is subjected to rinsing by discharging a pure water from the pure water nozzle 81b onto the wafer W while rotating the wafer W (step 108). After completion of the rinsing, the wafer W is rotated at a high speed so as to perform a spin drying (step 109). Further, the wafer W having the resist film and the antireflection film removed therefrom is brought back into a prescribed position within the carrier C (step 110).

A third method of removing the resist film by using the resist film-removing apparatus 100 will now be described with reference to the flow chart shown in FIG. 9. The third removing method is also employed suitably in the case where the films to be removed are a resist film adapted for the ArF line and an antireflection film that is formed together with the resist film.

Figure 9:
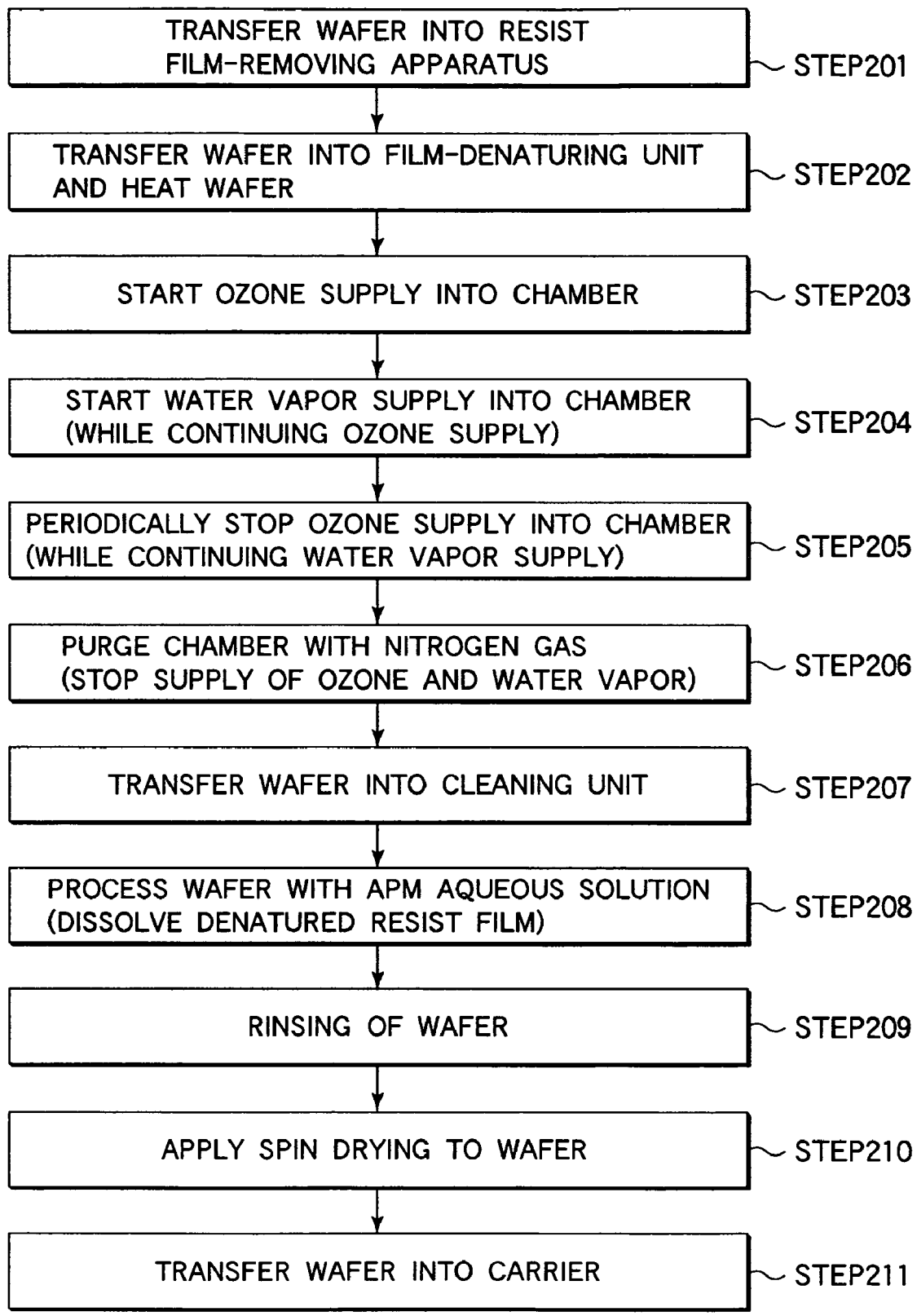
FIG. 9 is a flow chart showing a third removing method of a resist film.

Steps 201 to 204 shown in FIG. 9 are equal to steps 101 to 104 included in the flow chart shown in FIG. 8 directed to the second removing method described above and, thus, the detailed description of steps 201 to 204 are omitted. Under the state of step 204, i.e., under the state that the wafer W is housed in the chamber 30 and is retained at a prescribed temperature, ozone (or ozone/nitrogen mixed gas) and a water vapor are supplied into the chamber 30 at prescribed flow rates. A prescribed time later, the ozone supply is periodically stopped while continuing the supply of the water vapor into the chamber 30 so as to bring about the state that a large number of water molecules are present in the chamber 30 (step 205) as in step 5 included in the first removing method described previously.

After completion of step 205, subsequent steps 206 to 211 are carried out as in steps 105 to 110 included in the second removing method of the resist film described previously.

As apparent from the description given above, the second removing method and the third removing method of the resist film differ from each other in solely the aspect as to whether to employ the step of increasing the amount of the water molecules within the chamber 30 in the denaturing process using ozone and a water vapor. It suffices to select appropriately the suitable method in view of, for example, the molecular structure of the resist material, the thickness of the resist film, and the through-put of the resist film-removing apparatus 100.

It should be noted that the embodiments described above are simply intended to clarify the technical idea of the present invention. Naturally, the technical scope of the present invention should not be construed solely on the basis of the specific embodiments described above. In other words, the present invention can be worked in variously modified fashions on the basis of the spirit of the present invention and within the scope defined in the accompanying claims.

For example, in the description given above, the resist film-removing apparatus 100 is directed to an apparatus for processing the wafer W one by one, i.e., a so-called "sheet type processing apparatus". However, it is possible to use an apparatus capable of processing a plurality of wafers W, e.g., 25 wafers W, at a time, i.e., a so-called "batch type processing apparatus" when it comes to the denaturing processing applied to the resist film and the water cleaning applied to the wafer W.

Also, in the step of periodically stopping the ozone supply into the film-denaturing units (VOS) 15a to 15h while supplying a water vapor into the chamber 30 at a prescribed flow rate (step 5 or step 205), it is possible to periodically decrease the ozone supply flow rate in place of stopping completely the ozone supply into the film-denaturing units (VOS) 15a to 15h. Further, the period (time) for stopping the ozone supply can be determined appropriately. However, it is not absolutely necessary for the ozone supply-stopping period to be a constant time, and it is possible to change the ozone supply-stopping period within the same step, i.e., within step 5 and step 205 included in the resist film-removing methods described above.

Further, in processing the wafer W with ozone and a water vapor, it is possible for the processing agent to further contain another component such as hydrogen peroxide. Also, in the case where it is possible to further increase the solubility of the resist film by irradiating the surface of the wafer W with an ultraviolet light before or after the processing of the wafer W with ozone and a water vapor, it is desirable to employ the particular processing method.

To reiterate, in the second and third removing methods of the resist film, the denatured resist film and the antireflection film are removed by using an alkaline aqueous solution after the denaturing processing applied to the resist film and the antireflection film by using ozone and a water vapor. It is possible to employ the particular second and third removing methods of the resist film for removing the resist film adapted for the KrF line, both the resist film adapted for the KrF line and the antireflection film (BARC) that is formed together with the resist film adapted for the KrF line, and a resist film cured by, for example, an ion implantation. Where the denatured resist film and antireflection film are removed by using an alkaline aqueous solution as in the second and third removing methods of the resist film, it is possible to achieve a high processing rate, compared with the case of using a pure water for removing the denatured resist film and antireflection film.

In the processing with a process liquid (alkaline aqueous solution) that is carried out in the cleaning units (CLN) 12a to 12d, it is possible to use a nozzle capable of discharging a mixed fluid consisting of a process liquid and a gas such as a nitrogen gas. In this case, the mixed fluid is sprayed onto the surface of the wafer W while scanning the nozzle over the wafer surface. Likewise, the processing with a pure water can be performed by using a nozzle capable of spurting a mixed fluid consisting of a pure water and a gas. In this case, the mixed fluid is sprayed onto the surface of the wafer W while scanning the nozzle over the wafer surface.

Still further, in the description given above, a semiconductor wafer is exemplified as the substrate. However, the substrate used in the present invention is not limited to the semiconductor wafer. It is also possible to use, for example, a glass substrate used in the flat panel display (FPD) such as a liquid crystal display device (LCD).

What is claimed is:

1. A computer-readable storage medium storing program instructions for execution by a computer used in a substrate processing apparatus that comprises a chamber equipped with a heating mechanism and configured to house a substrate having a resist film formed thereon, a water vapor supply section configured to supply water vapor into the chamber, an ozone supply section configured to supply ozone into the chamber, a liquid process section configured to supply a prescribed process liquid onto the substrate to carry out a liquid processing, and a control section including the computer and configured to control an operation of the apparatus, wherein the program instructions, when executed by the computer, cause the computer to execute a substrate processing method for removing the resist film from the substrate in the substrate processing apparatus, the method comprising:

denaturing the resist film by maintaining an inner region of the chamber, which houses the substrate having the resist film formed thereon, at a prescribed temperature and supplying ozone and water vapor into the chamber in such a manner that the ozone is supplied into the chamber at a ratio being adjusted relative to the water vapor while the water vapor is supplied into the chamber at a prescribed flow rate, and an exhaust flow rate from the chamber is adjusted, such that the dew formation within the chamber is prevented; and then, processing the substrate by use of the prescribed process liquid, thereby removing the denatured resist film from the substrate.

2. The computer-readable storage medium according to claim 1, wherein the method comprises periodically stopping supply of the ozone into the chamber.

3. The computer-readable storage medium according to claim 1, wherein said denaturing the resist film further includes measuring pressure inside the chamber to obtain a measurement value and controlling an exhaust flow rate from the chamber in accordance with the measurement value to prevent the pressure from exceeding a set value predetermined to prevent dew formation from being caused inside the chamber at the prescribed temperature.

4. The computer-readable storage medium according to claim 1, wherein the resist film is a resist film adapted for the KrF line, and pure water or an alkaline aqueous solution is used as the prescribed process liquid in said removing the denatured resist film from the substrate.

5. The computer-readable storage medium according to claim 1, wherein the resist film is a resist film adapted for the KrF line, which is formed together with an antireflection film, and an alkaline aqueous solution is used as the prescribed process liquid in said removing the denatured resist film from the substrate.

6. The computer-readable storage medium according to claim 5, wherein the alkaline aqueous solution is selected from the group consisting of an APM aqueous solution, an aqueous solution of ammonium hydroxide, and an aqueous solution of tetramethyl ammonium hydroxide (THAM).

7. The computer-readable storage medium according to claim 1, wherein the resist film is a resist film adapted for the ArF line, and an alkaline aqueous solution is used as the prescribed process liquid in said removing the denatured resist film from the substrate.

8. The computer-readable storage medium according to claim 7, wherein the alkaline aqueous solution is selected from the group consisting of an APM aqueous solution, an aqueous solution of ammonium hydroxide, and an aqueous solution of tetramethyl ammonium hydroxide (THAM).

9. The computer-readable storage medium according to claim 1, wherein the resist film is a resist film adapted for the ArF line, which is formed together with an antireflection film, and an alkaline aqueous solution is used as the prescribed process liquid in said removing the denatured resist film from the substrate.

10. The computer-readable storage medium according to claim 9, wherein the alkaline aqueous solution is selected from the group consisting of an APM aqueous solution, an aqueous solution of ammonium hydroxide, and an aqueous solution of tetramethyl ammonium hydroxide (THAM).

11. The computer-readable storage medium according to claim 1, wherein the method comprises exhausting the chamber such that inside the chamber is maintained at a prescribed positive pressure in said denaturing the resist film.

* * * * *